US007045843B2

(12) United States Patent
Goto et al.

(10) Patent No.: US 7,045,843 B2
(45) Date of Patent: May 16, 2006

(54) SEMICONDUCTOR DEVICE USING MEMS SWITCH

(75) Inventors: Yasushi Goto, Kokubunji (JP); Shuntaro Machida, Kokubunji (JP); Natsuki Yokoyama, Mitaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/788,369

(22) Filed: Mar. 1, 2004

(65) Prior Publication Data

US 2005/0067621 A1 Mar. 31, 2005

(30) Foreign Application Priority Data

Sep. 30, 2003 (JP) ............................ 2003-339156

(51) Int. Cl.
*H01L 27/108* (2006.01)
*H01L 29/76* (2006.01)

(52) U.S. Cl. ...................................... 257/296; 257/299

(58) Field of Classification Search ................ 257/296, 257/299, 319

See application file for complete search history.

(56) References Cited

U.S. PATENT DOCUMENTS

| | | | | |
|---|---|---|---|---|
| 5,774,414 | A | 6/1998 | Melzner et al. | |
| 6,124,650 | A | 9/2000 | Bishop et al. | |
| 6,625,047 | B1 * | 9/2003 | Coleman, Jr. ................ | 365/51 |

FOREIGN PATENT DOCUMENTS

| | | |
|---|---|---|
| JP | 9-63293 | 8/1996 |
| JP | 2001-176369 | 10/2000 |

* cited by examiner

*Primary Examiner*—Phat X. Cao
*Assistant Examiner*—Theresa T. Doan
(74) *Attorney, Agent, or Firm*—Reed Smith LLP; Stanley P. Fisher, Esq.; Juan Carlos A. Marquez, Esq.

(57) ABSTRACT

Disclosed herein is a latchable MEMS switch device capable of retaining its ON or OFF state even after the external power source is turned off. It is unnecessary not only to introduce novel materials such as magnetic material but also to form complicated structures. At least one of the cantilever and pull-down electrode of a cold switch is connected to a second MEMS switch. A capacitor between the cantilever and pull-down electrode of the cold switch is charged by the second MEMS switch. Thereafter since the cold switch is isolated in the device, the charge remains stored. Therefore, the cold switch can remain in the ON state since the charge continues to create electrostatic attraction between the cantilever and the pull-down electrode.

16 Claims, 16 Drawing Sheets

SEMICONDUCTOR DEVICE USING MEMS SWITCH

FIELD OF THE INVENTION

The present invention relates to semiconductor devices using MEMS (Micro Electro Mechanical System) switches which operate mechanically by converting electrostatic force to actuating force, and more particularly to a semiconductor device using MEMS switches capable of remaining turned on or off even if power from a power source to the MEMS switches is stopped.

RELATED ARTS

Due to the progress in lithography technology of semiconductor manufacture, semiconductor devices with design rules of 130 nm to 90 nm are being produced. In addition, the wafer size is advancing from 200 mm to 300 mm in diameter with advancing semiconductor manufacture equipment. Where 300 mm diameter wafers are combined with a design rule of 130 nm or finer, chips are produced in large quantities at a time. In this situation, cell-based system LSI development is not allowed unless the system LSI is expected to be consumed in large quantities. For a user demanding various kinds of products in small quantities, cell-based IC development does not pay in many cases due to the rising cost for masks, test production and development.

Directed to these demands, reconfigurable logic devices (or reconfigurable processors) are now under development. A reconfigurable logic device has a programmable logic device (such as an FPGA) combined with a microcomputer therein and allows the user to immediately realize a custom LSI by configuring user-defined functions into the programmable logic device. An FPGA is needed for where the configuration is implemented according to a program. In this FPGA block, each cell is composed of, for example, a 4-input look-up table and a flip-flop. Upon power on, configuration data is sent from a ROM (such as a flash memory) where the user program is stored. Logical operation begins after the control register is set so as to indicate the operation of the flip-flop in each cell has been programmed with the configuration data. In this architecture, since configuration data, namely, a user program is recorded as the flip-flop operations of the cells, the logical states cannot be retained if the power source is stopped.

Application of these reconfigurable logic LSIs to communication equipment and mobile devices is being considered. In particular in the case of mobile devices, chip size reduction and power saving are required. Accordingly, we have considered using MEMS switches with latch mechanism instead of flip-flops. The MEMS switch is an ideal switch showing an on-resistance of substantially 0 and a substantially infinite off-resistance since it mechanically connects/disconnects a contact to/from another contact. If bistable MEMS switches, that is, MEMS switches with latch mechanism are used, not only the voltage-keeping circuit can be omitted but also power consumption can be reduced since no power is required to keep the state of each switch.

In addition, MEMS switches can also be used to dynamically power on/off circuit blocks on each block basis. Although attempts to use MOS transistors for source power control have so far been made, they must enlarge the chip size if all circuit blocks are controlled since the channel width of each transistor must be enlarged according to the magnitude of current flowing through the corresponding circuit block. Contrastingly in the case of MEMS switches, it is not necessary to enlarge the chip size since metal contacts allow a large magnitude of current to flow therethrough and they can be formed in a wiring layer not like those of transistors that must be formed on the surface of the Si substrate.

To add latch mechanism to a MEMS switch, various attempts have so far been made. For example, in Patent Document 1 (Japanese Patent Laid-open No. 2001-176369), a magnetic material is used to make a MEMS switch latchable as shown in FIG. 15. This switch is on when a contact 14 on a cantilever 13 is brought into contact with a contact 16 on another substrate 18 opposite to the cantilever 13. In this switch, a magnetic element 15 is placed on the cantilever 13 formed on a substrate 11 and a magnetic element 17 is placed on the pull-down electrode 18. The magnetic element 15 is magnetized by a coil 12 placed below the cantilever 13 to create a magnetic force which is used to keep the switch in the on state.

In another method disclosed in Patent Document 2 (Japanese Patent Laid-Open No. 1997-63293), a diaphragm 23 is used as a latch to form a memory cell (MEMS switch). This switch turns off if the diaphragm 23 becomes curved upward away from the support. If the diaphragm 23 becomes curved downward into the open region to come in contact with a pull-down electrode 22 formed on a substrate 21, the switch turns on.

Further, such methods as to mechanically implement a latch by thermal actuation and implement a latch by a devised mechanical structure have been proposed.

SUMMARY OF THE INVENTION

In most of these known examples, latch mechanism is implemented by introducing a novel material such as a magnetic material or forming a complicated structure on the device surface. If a novel material, particularly a magnetic material, is used, contamination control and special cleaning must be added since such a material has been treated as contaminant material for semiconductor devices. In addition, if a complicated structure is formed, the process may probably become complicated since it must be formed on the semiconductor wafer concurrently with other conventional elements.

Therefore, it is an object of the present invention to implement a simply structured MEMS switch with latch mechanism without introducing a novel material such as a magnetic material.

According to the present invention, two or more MEMS switches are combined to make it possible for an MEMS switch to remain in the on state or in the off state even if the external power supply is stopped. There are two types of MEMS switches: hot switches and cold switches. In a hot switch, a cantilever and a contact on cantilever are at the same voltage, that is, the cantilever also serves as a contact on cantilever to propagate an electrical signal. In a cold switch, a cantilever is insulated from a contact on cantilever so that the electrical signal to be propagated can be controlled independently of the actuation of the cantilever.

According to the present invention, two MEMS switch are connected in series. The rear switch is a cold switch whereas the front switch is a hot switch. In the cold switch, a capacitor is formed by the cold switch's main portion (cantilever) carrying the switch terminal of the cold switch and a pull-down electrode placed opposite to the cantilever. This capacitor is charged via the front MEMS switch to create attraction between the respective electrodes (cantilever and pull-down electrode). This attraction is used to actuate the cold switch. Charging the capacitor via the front MEMS switch turns on the cold switch whereas discharging the capacitor via the front MEMS switch turns off the cold switch.

As described above, according to the present invention, two or more MEMS switches, including the rear cold switch, are combined so as to make the rear cold switch latchable by accumulating charge between the cantilever and pull-down electrode of the rear cold switch.

BRIEF DESCRIPTION OF THE DRAWINGS

FIGS. 1A through 1C are diagrams for explaining a MEMS switch with latch mechanism according to a first embodiment of the present invention, in which FIG. 1A illustrates a cross section of the switch device, FIG. 1B is a top view of the switch, and FIG. 1C is a timing chart indicating how the switch device is operated;

FIG. 9A through 9C are diagrams for explaining a MEMS switch with latch mechanism according to a third embodiment of the present invention, in which FIG. 9A illustrates a cross section of the switch device, FIG. 9B is a top view of the switch device and FIG. 9C is a timing chart indicating how the switch device is operated;

DESCRIPTION OF THE PREFERRED EMBODIMENTS

Embodiment 1

Figure 1A:
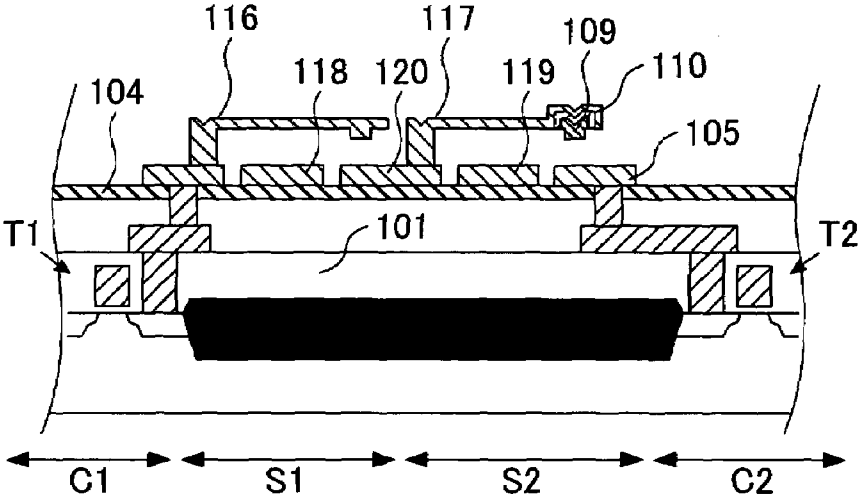
Figure 1B:
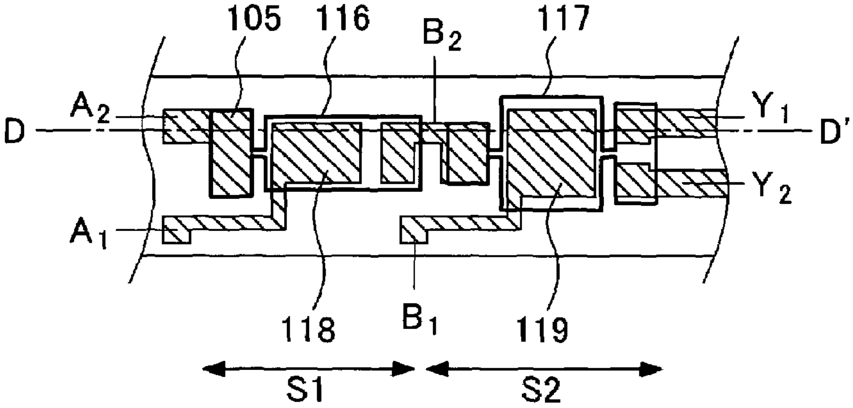
Figure 1C:
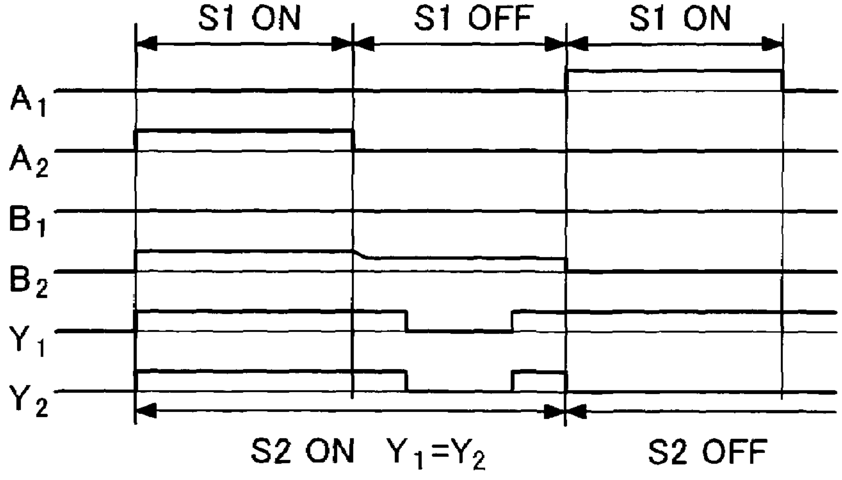

Referring to FIG. 1, the following describes a MEMS switch device according to a first embodiment of the present invention. FIG. 1A is a section view of the structure of the MEMS switch device according to the present invention while FIG. 1B is a top view of the MEMS switch device. The sectional structure in FIG. 1A is depicted along line D–D' in FIG. 1B. This MEMS switch is composed of two switches, i.e., a front switch S1 and a rear switch S2. In this embodiment, the front switch S1 is fabricated as a hot switch while the rear switch S2 as a cold switch.

The hot switch S1 is turned on when a voltage is applied to between two electrodes of a capacitor, a cantilever 116 and a pull-down electrode 118, since the cantilever 116 is attracted toward the pull-down electrode 118 and therefore short-circuited with a contact of signal line 120 (or a stationary contact). In the rear cold switch S2, an insulator 110 is sandwiched between a cantilever 117 and a contact 109 on the cantilever (or a mobile contact). When a voltage is applied to between two electrodes, the cantilever 117 and a pull-down electrode 119, the cantilever 117 is attracted toward the pull-down electrode 119 likewise in the hot switch and thus the contact 109 on the cantilever short-circuits two stationary contacts (wiring lines) Y1 and Y2 with each other so as to allow a signal to be propagated between them. This operation is described below with reference to the top view in FIG. 1B and a timing chart in FIG. 1C.

To turn on the switch S2, a cantilever electrode terminal A2 of the switch S1 is set to +Vcc and a pull-down electrode terminal A1 of the switch S1 and a pull-down electrode terminal B1 of the switch S2 are set to GND. Since this forms a potential difference of |Vcc| between the cantilever 116 and pull-down electrode 118 of the switch S1, the switch S1 is turned on to short-circuit the cantilever 116 with the contact 120 of signal line. While the switch S1 is in the ON state, the cantilever electrode terminal A2 is set to +Vcc, so the cantilever electrode terminal B2 of the switch S2 is set to +Vcc. This forms a potential difference of |Vcc| between the cantilever 117 and the pull-down electrode 119 of the switch S2 and therefore turns on the switch S2. In this state, the contact 109 on the cantilever short-circuits the two wiring terminals (stationary contacts) Y1 and Y2 with each other, resulting in Y1=Y2.

Thereafter, if the cantilever terminal A2 of the switch S1 is set to GND, the switch S1 goes into the OFF state whereas the switch S2 remains in the ON state since the potential difference between the cantilever 117 and pull-down electrode 119 can be retained due to the charge accumulated to the cantilever 117.

Actually, however, when the switch S1 is turned off, the charge accumulated between the cantilever 117 and pull-down electrode 119 of the switch S2 is partly released. If this discharge is large in quantity, the potential difference between the cantilever 117 and pull-down electrode 119 of the switch decreases, perhaps making it impossible to retain the switch S2 in the ON state. Therefore, the electrode size of the capacitor in the switch S2 is designed larger than that in the switch S1 in order to raise the quantity of charge. In addition, the gap between the upper and lower electrodes (cantilever to pull-down electrode gap) of the switch S2 is designed so narrow that the switch S2 can remain in the ON state even if the potential difference somewhat decreases when the switch S1 is turned off.

Then, if the stationary electrode terminal A1 of the switch S1 is set to +Vcc, a potential difference of |Vcc| is formed between the cantilever 116 and pull-down electrode 118 of the switch S1, which turns on the switch S1 to short-circuit the cantilever 116 with the contact 120 of signal line. Thus, the voltage B2 of the cantilever electrode 117 in the switch S2 is set to GND since the cantilever terminal A2 is set to GND. This turns off the switch S2 since the charge accumulated in the capacitor of the switch S2 is released due to no potential difference between the cantilever 117 and pull-down electrode 119.

As shown in FIG. 1A, each of the terminals A1 and A2 of the hot switch S1 is connected to a MOS transistor T1 in a voltage supply circuit C1. Likewise, each of the stationary contact terminals Y1 and Y2 of the cold switch S2 is connected to a MOS transistor T2 in a signal circuit C2.

Theoretically, the ON-OFF control of the cold switch S2 can also be implemented by using a MOS transistor instead of the hot switch S1 and switching on/off the MOS transistor. Practically, however, it is impossible to keep the cold switch S2 in the ON state since the charge in the cold switch S2 is gradually released due to the leak current flowing through the MOS transistor in the OFF state. Accordingly, by using the MEMS switch S1 capable of physically disconnecting the voltage supply circuit, the present invention makes it possible to surely retain the ON state.

Although in the above description of the cold switch S2, a potential difference of |Vcc| is formed between the electrodes of the capacitor by setting the pull-down electrode B1 to GND and giving +Vcc to the cantilever B2, it is also possible to turn on the switch S2 and keep the switch S2 in the ON state by giving +Vcc to the pull-down electrode B1 and GND to the cantilever B2 so as to form the potential difference of |Vcc| between the electrodes. In this case, the contact 120 of the switch S1 is connected not to the cantilever 117 of the switch S2 as shown in FIGS. 1A and 1B but to the pull-down electrode 119 of the switch S2 since the switch S2 cannot retain the ON state due to the leak current flowing through the MOS transistor in the voltage supply circuit C1 if the pull-down electrode B1 is directly connected to the voltage supply circuit C1.

Figure 2:
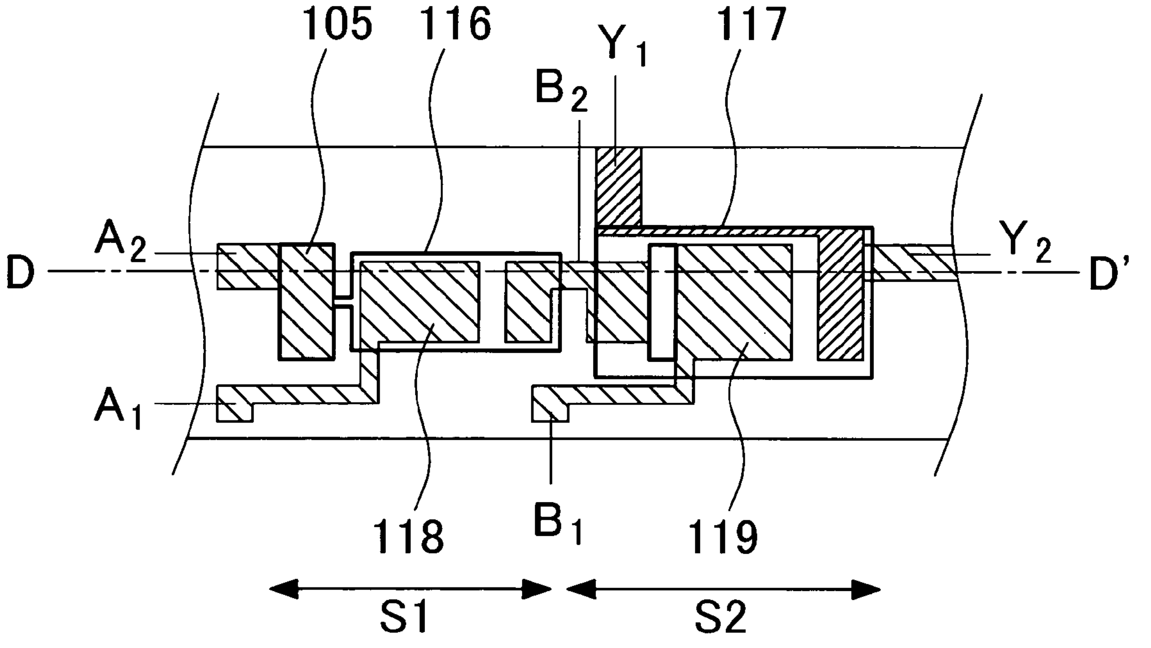
FIG. 2 shows a modified embodiment of the MEMS switch with latch mechanism according to the first embodiment of the present invention.

In addition although in the above description of the cold switch S2, the contact 109 on the cantilever short-circuits the two stationary contacts Y1 and Y2 which are connected to the signal circuit C2, the switch S2 may also be configured in such a manner that as shown in FIG. 2, it has a mobile contact Y1 and a stationary contact Y2 and short-circuits them which are connected to the signal circuit C2. In this cold switch S2 shown in FIG. 2, however, the mobile portion is unbalanced due to the center of electrostatic force deviated from the center of actuation since wiring is required to electrically draw the mobile contact. From the viewpoint of design, it is therefore preferable to configure the cold switch S2 as shown in FIG. 1B.

The following describes how to manufacture a MEMS switch device of the present embodiment.

Figure 3A:
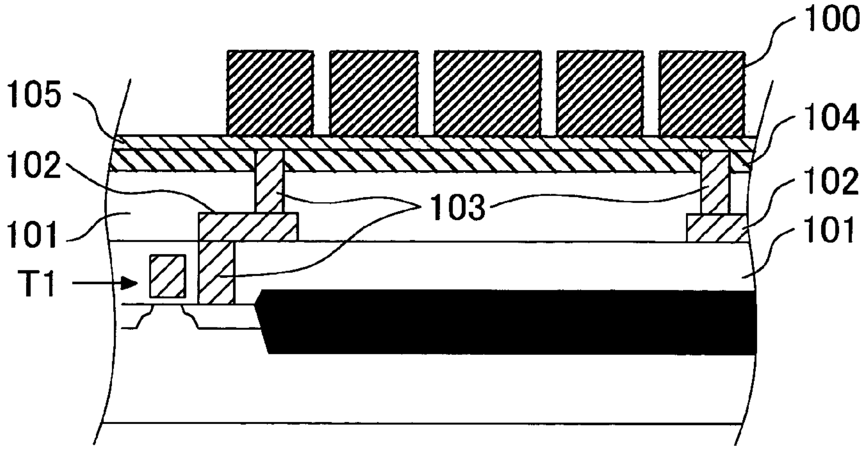
FIGS. 3A through 3D are cross-sectional views partly indicating how the MEMS switches in the first embodiment of the present invention are fabricated.
Figure 3B:
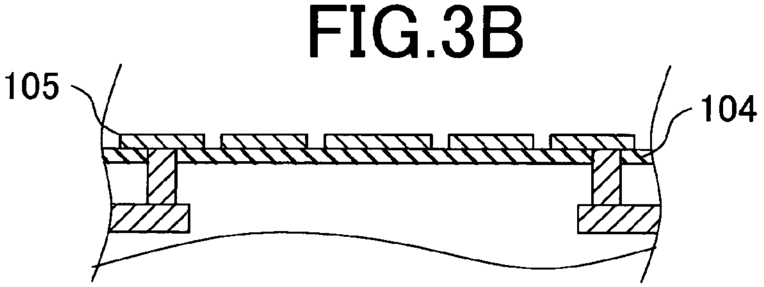

In FIG. 3A, MEMS switches are being formed on the top of a wafer where a voltage supply circuit C1 and a signal circuit C2 are formed. Note that the signal circuit is omitted in the figure. There are underlayer metal lines 102 buried in an interlayer dielectric film 101. The underlayer metal lines 102 are connected to transistors T1 via plugs 103. SiN is deposited as a cap film 104 for the interlayer dielectric film 101 and holes are formed in the SiN cap film 104 and the interlayer dielectric film 101. After the plugs 103 are buried in the holes, planarization is made. Then, an underlayer metal film 105 is deposited which is to be used to form the pull-down electrodes and stationary contacts of the MEMS switches. Here, poly-Si is used. A pattern for the pull-down electrode and stationary contacts is transferred to a resist 100 on the poly-Si film 105 by photo-lithography process. This resist is removed after used as a mask to etch the poly-Si film 105 (FIG. 3B).

Figure 3C:
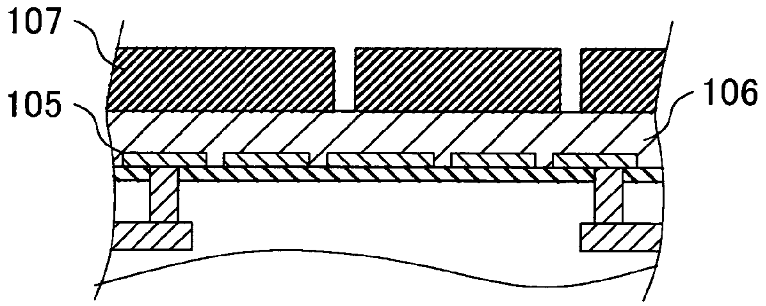

After the surface is cleaned, plasma TEOS is deposited as a sacrifice film 106, which is to be removed to form a gap in the switches. A pattern that has holes corresponding to the mobile contacts of the switches is transferred to a resist 107 as shown in FIG. 3C.

Figure 3D:
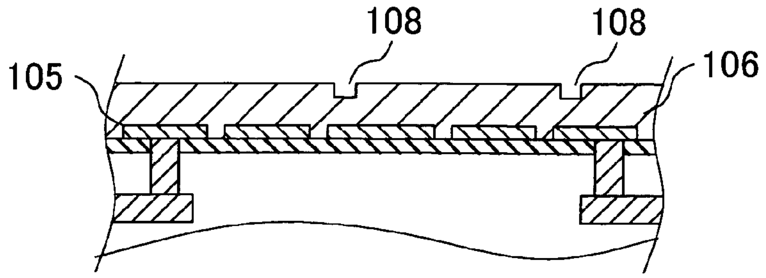

After dents 108 are formed by etching, using this resist as a mask, the resist is removed as shown in FIG. 3D. Although it is also possible to form the cantilever and mobile contact without forming these dents 108, these dents 108 make the switches more reliable since the cantilever 116 and mobile contact 109 can have projections respectively for contact with the stationary contacts 120 and 105.

Figure 4A:
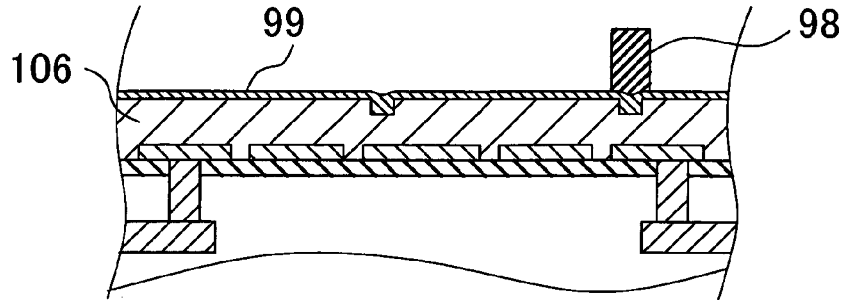
FIGS. 4A through 4D are cross-sectional views partly indicating how the MEMS switches in the first embodiment of the present invention are fabricated.

Then, after the surface is cleaned, poly-Si is deposited as a metal film 99 to be used to form a mobile contact. Then, by photo-lithography process, a resist pattern 98 is formed only for the mobile contact on the side of the cold switch S2 (FIG. 4A).

Figure 4B:
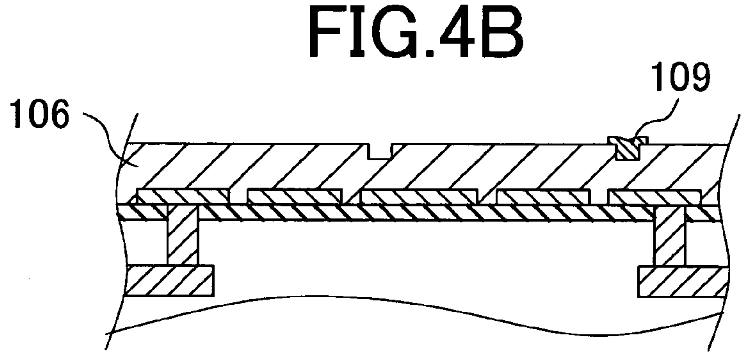

As shown in FIG. 4B, the resist 98 is removed after used as a mask to etch the electrode terminal 109.

Figure 4C:
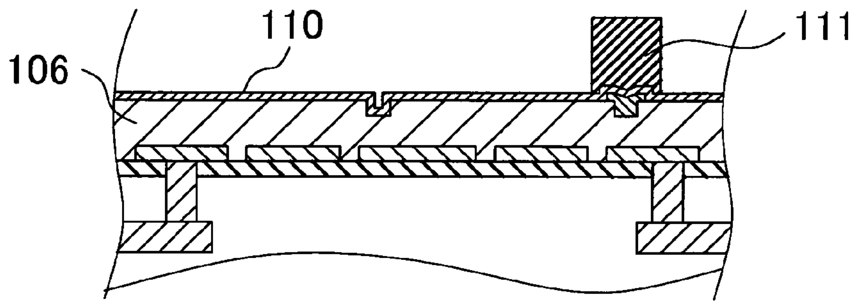

Then, after an insulator 110 is deposited on the electrode terminal 109, a mobile contact of the cold switch S2, and on the sacrifice layer 106, a resist pattern 111 is formed as to cover the electrode terminal 109 of the cold switch S2 as shown in FIG. 4C. In the present embodiment, aluminum oxide is used to form the insulator 110.

Figure 4D:
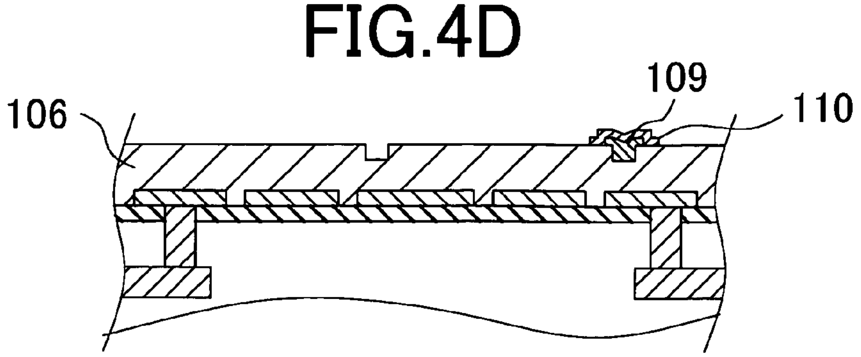

Then, the insulator 110 is removed by dry etching and the resist 111 is removed as shown in FIG. 4D.

Figure 5A:
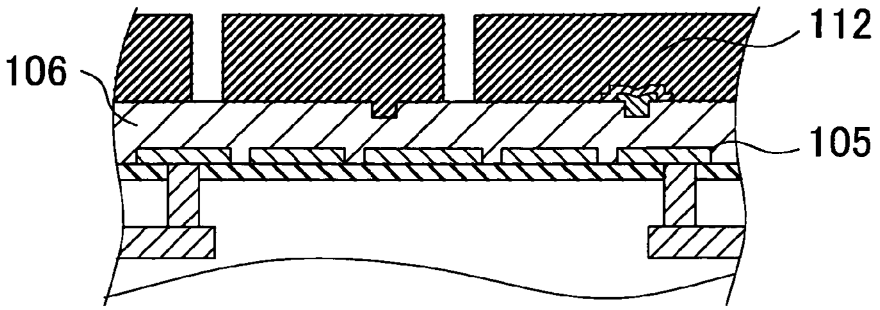
FIGS. 5A through 5D are cross-sectional views partly indicating how the MEMS switches in the first embodiment of the present invention are fabricated.

Further, after cleaning process is done, a resist pattern 112 is formed by photo-lithography process to make contact holes for the cantilevers as shown in FIG. 5A.

Figure 5B:
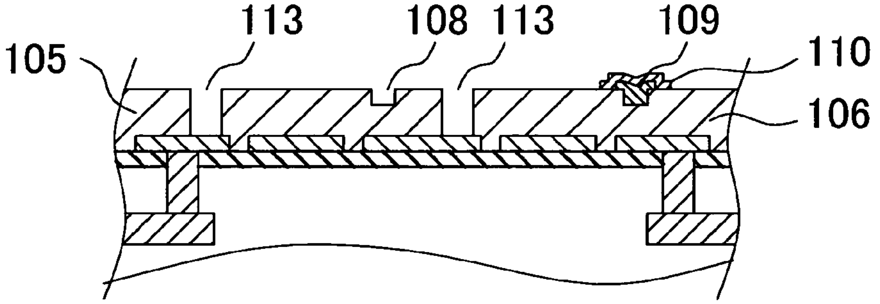

After the sacrifice layer 106 is etched by using this resist 112 as a mask until the contact holes 113 reach the surface of the underlayer metal film 105, the resist 112 is removed as shown in FIG. 5B.

Figure 5C:
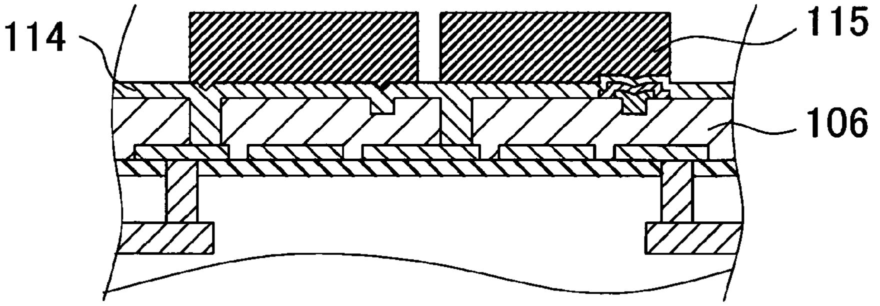

Into these contact holes 113 and onto the sacrifice layer 106, a metal film 114 is deposited. Thereafter, a pattern for the cantilevers of the switches is transferred to a resist 115 as shown in FIG. 5C. In the present embodiment, the cantilevers are made of poly-Si.

Figure 5D:
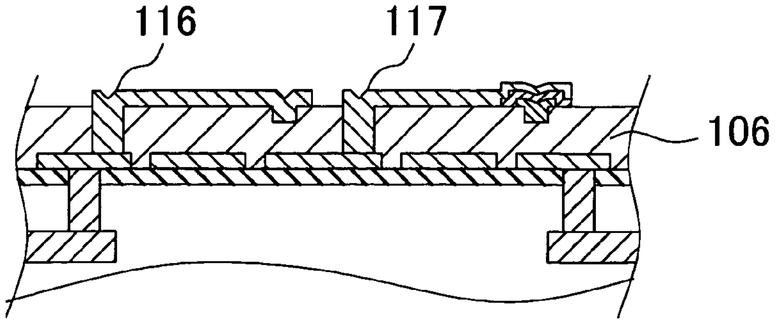

The cantilever 116 of the hot switch and that 117 of the cold switch are formed by etching the metal film 114 by using the resist pattern 115 as a mask. Thereafter, the resist 115 is removed (FIG. 5D).

Then, after the sacrifice layer 106 is removed by wet etching, the wafer is dried to complete the switch structure shown in FIG. 1A. In the present embodiment, buffered hydrogen fluoride is used to remove the sacrifice layer 106. The wafer is cleaned with water after the wet etching. If the wafer is dried just after cleaned with water, the cantilevers 116 and 117 may stick respectively to the pull-down electrodes 118 and 119 due to the surface tension of water. Therefore the wafer is dipped with methanol before super critical carbon dioxide drying is done finally.

After the MEMS switch structure is formed, its top surface is sealed with glass or ceramics for isolation from the outer environment. In this sealing, it is preferable to fill the inside with an inert gas or depressurize the inside.

Figure 6A:
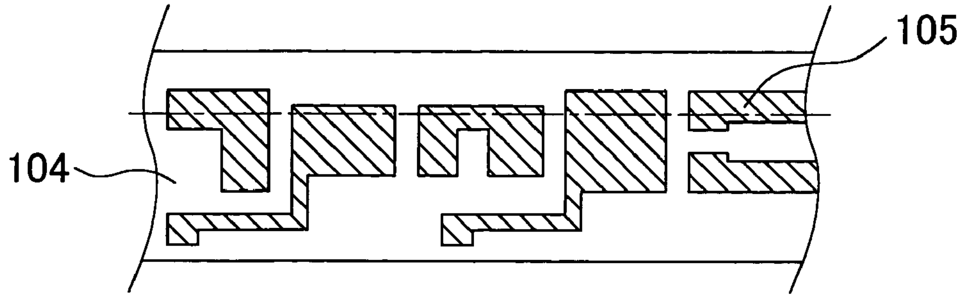
FIGS. 6A through 6C are top views of the MEMS switches in the first embodiment of the present invention.
Figure 6B:
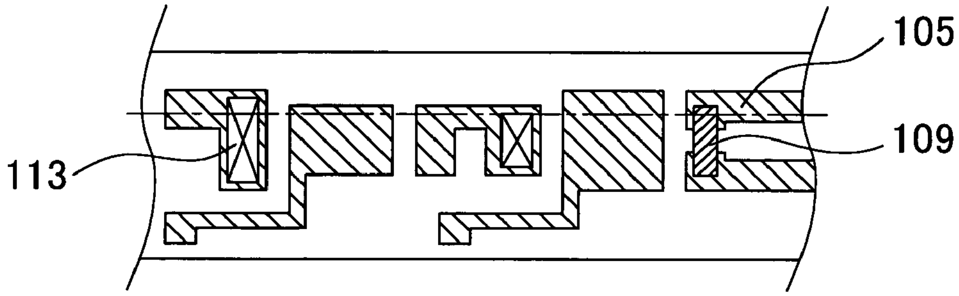
Figure 6C:
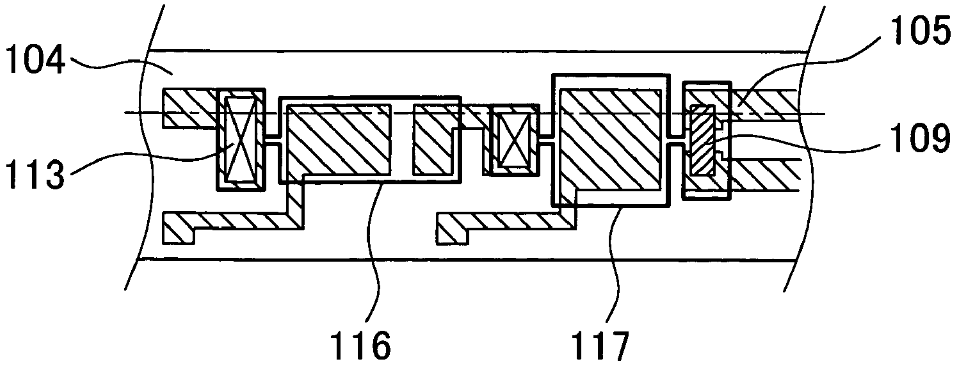

FIGS. 6A through 6C are top views of the MEMS switch device. FIG. 6A is depicted after the underlayer metal film 105 is patterned as shown in FIG. 3B. FIG. 6B corresponds to FIG. 5B and shows the positional relations among the cantilever terminal (mobile contact) 109 of the cold switch S2, the contact holes 113 to respectively connect the cantilevers to the underlayer metal lines 105, and the underlayer metal lines 105. Further, FIG. 6C shows the positional relations among the mobile contact 109, the underlayer metal lines 105, the contact holes 113 and the cantilevers 116 and 117. The contact holes 113 are filled with mobile electrode material poly-Si. This figure is a top view of a latchable MEMS switch device composed of one hot switch S1 and one cold switch S2. Its operation has been described earlier with reference to FIG. 1.

Embodiment 2

The following describes a second embodiment of the present invention where a latchable cold switch is realized by using two hot switches.

Figure 7A:
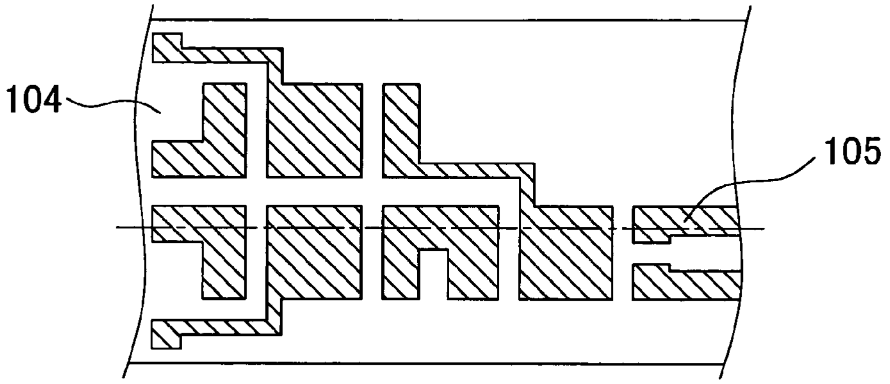
FIGS. 7A through 7C are top views of MEMS switches according to a second embodiment of the present invention.
Figure 7B:
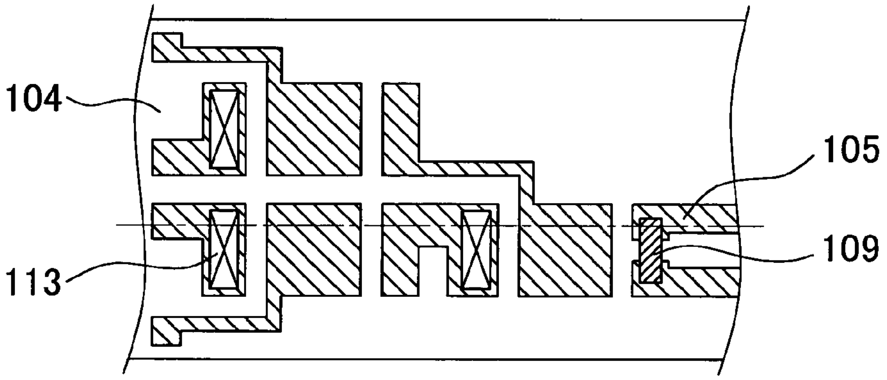
Figure 7C:
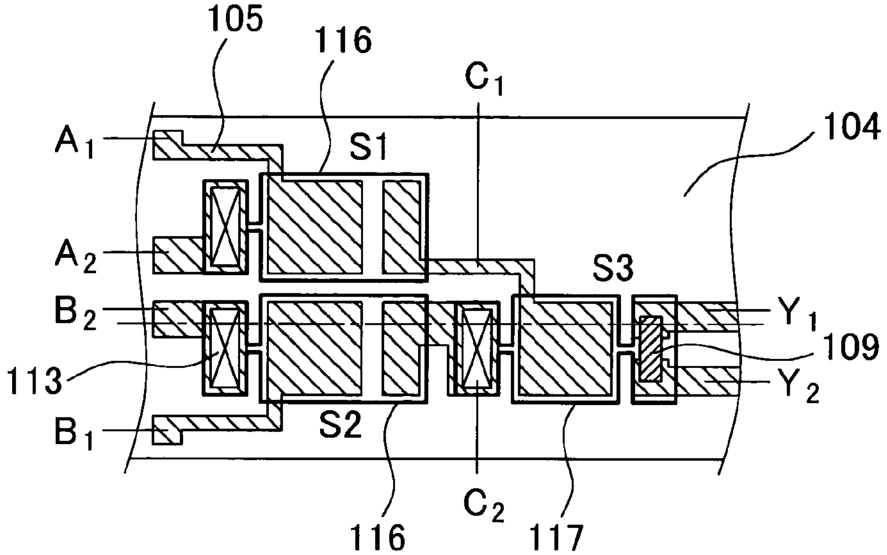

Its manufacture process is similar to that shown in FIG. 3 through FIG. 5. FIGS. 7A through 7C show top views of the MEMS switch device. Also in this embodiment, the electrode size of the capacitor to keep the cold switch (S3 in FIG. 7) in the ON or OFF state should be larger than that of the front switches (S1 and S2 in FIG. 7) as mentioned earlier. In the case of the MEMS switch device shown in FIG. 7, all electrodes have the same size. Even such a MEMS switch device can operate reliably if the switch ON voltage is designed comparatively smaller than |Vcc|. FIG. 7A corresponds to FIG. 3B in the progress of process wherein the underlayer metal film is patterned. FIG. 7B corresponds to FIG. 5B in the progress of process and shows the positional relations among an electrode terminal (mobile contact) 109 of the cold switch S3, underlayer metal lines 105, and contact holes 113 to connect cantilevers respectively to the underlayer metal lines 105. Further, FIG. 7C shows the positional relations among the mobile contact 109, the underlayer metal lines 105, the contact holes 113 and cantilevers 116 and 117. The contact holes 113 are filled with cantilever material poly-Si.

Figure 8:
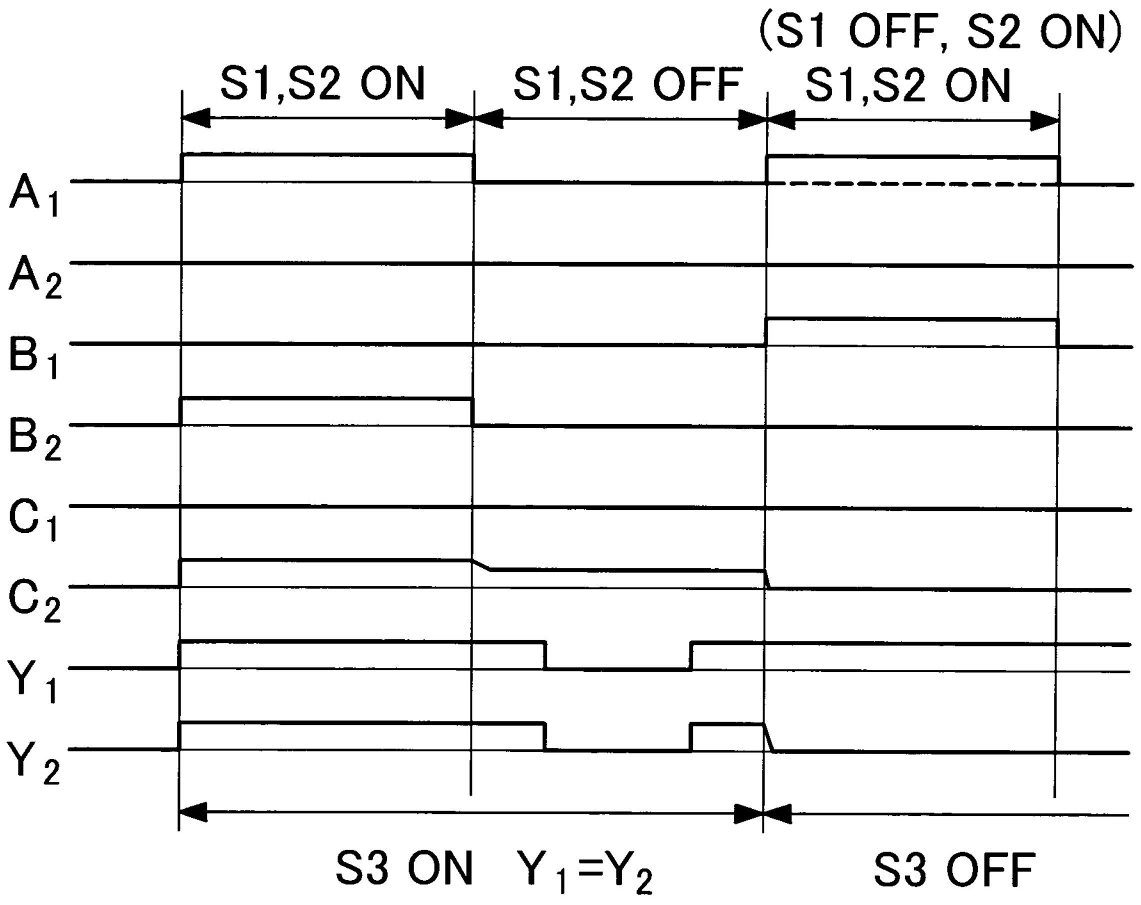
FIG. 8 is a timing chart for explaining how the MEMS switches in the second embodiment of the present invention are operated.

The latchable MEMS switch device composed of the hot switches S1 and S2 and the cold switch S3 is operated according to a timing chart in FIG. 8. The contact of cantilever A2 and the contact of pull-down electrode A1 of the hot switch S1 are respectively set to GND and +VCC to turn on the switch S1 and therefore set the pull-down electrode C1 of the cold switch S3 to GND. Meanwhile, the contact of pull-down electrode B1 and contact of cantilever B2 of the hot switch S2 are respectively set to GND and +VCC to turn on the switch S2 and therefore set the cantilever C2 of the cold switch S3 to +Vcc. At this time, since a potential difference of |Vcc| is formed between the pull-down electrode C1 and cantilever C2 of the cold switch S3, the switch S3 turns on and therefore short-circuits signal terminals (stationary contacts) Y1 and Y2 with each other via the contact 109 of cantilever.

Then, the hot switches S1 and S2 are turned off by switching the contact of pull-down electrode A1 and the contact of cantilever B2 to GND. However, the cold switch can remain in the ON state since the electrostatic attraction continues to work between the cantilever C2 and pull-down electrode C1 due to the charge accumulated between them although the potential difference between the pull-down electrode C2 and cantilever electrode C1 decreases from |Vcc| as mentioned earlier since the charge is partially released from the cantilever C2 when the hot switches S1 and S2 are turned off.

To turn off the cold switch S3, the contact of pull-down electrode A1 and contact of cantilever A2 of the switch are respectively set to +Vcc and GND and the contact of pull-down electrode B1 and the contact of cantilever B2 are respectively set to +Vcc and GND. Since this turns on the hot switches S1 and S2 but sets both pull-down electrode C1 and cantilever C2 of the cold switch S3 to GND, the accumulated charge is released to turn off the cold switch S3. Note that as indicated by a broken line in FIG. 8, the hot switch S1 must not necessarily be turned on to turn off the cold switch S3 since the pull-down electrode C1 is set to GND while the cold switch is in the ON state. The cold switch S3 can be turned off by turning on only the hot switch S2.

The aforementioned first embodiment can be implemented by a smaller area than the present embodiment since the first embodiment is composed of two switches. Meanwhile, the present embodiment can retain the cold switch S3 more reliably than the first embodiment since the pull-down electrode of the cold switch S3 is completely floating while the cold switch S3 is kept in the ON state. Note that the present invention can also be configured in such a manner that like the cold switch S2 in FIG. 2, the cold switch S3 has one contact of pull-down electrode and one contact of cantilever that are connected to a signal circuit.

Embodiment 3

In the aforementioned first and second embodiments, a latchable MEMS switch device is made by combining one or more hot switches with a cold switch. The same function can also be implemented by combining cold switches. The following describes such a third embodiment of the present invention.

Figure 9A:
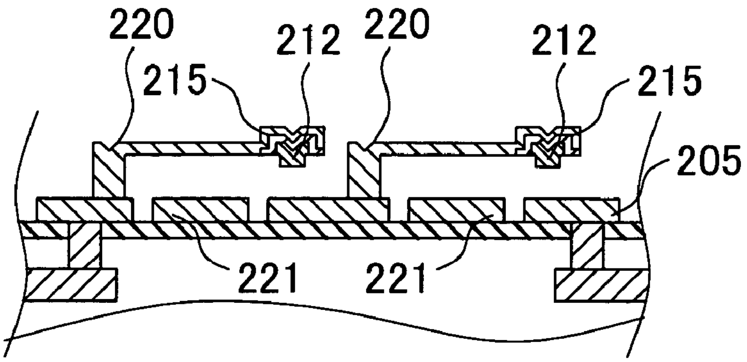
Figure 9B:
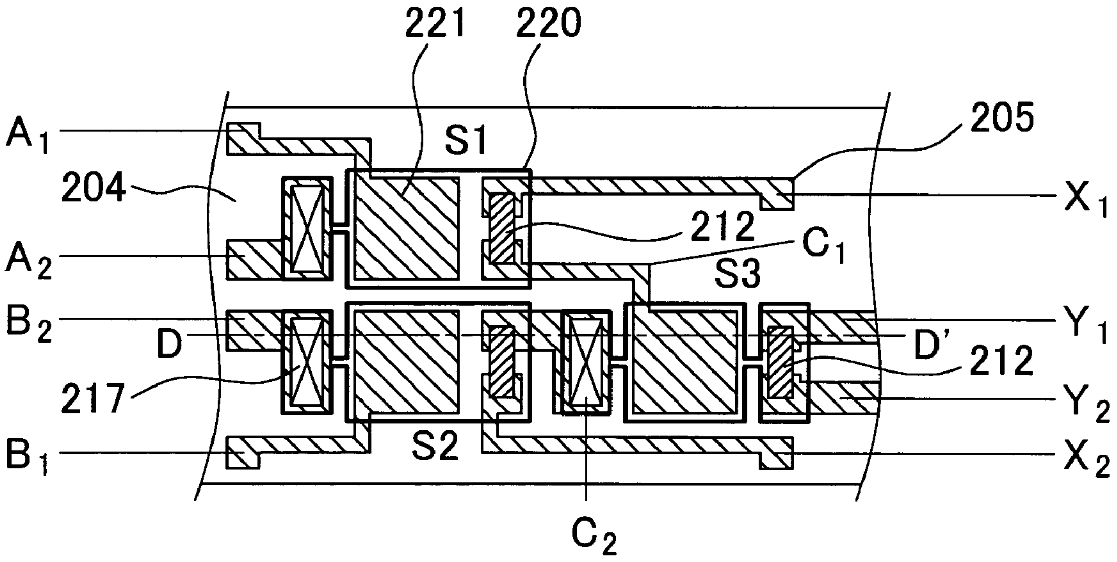
Figure 9C:
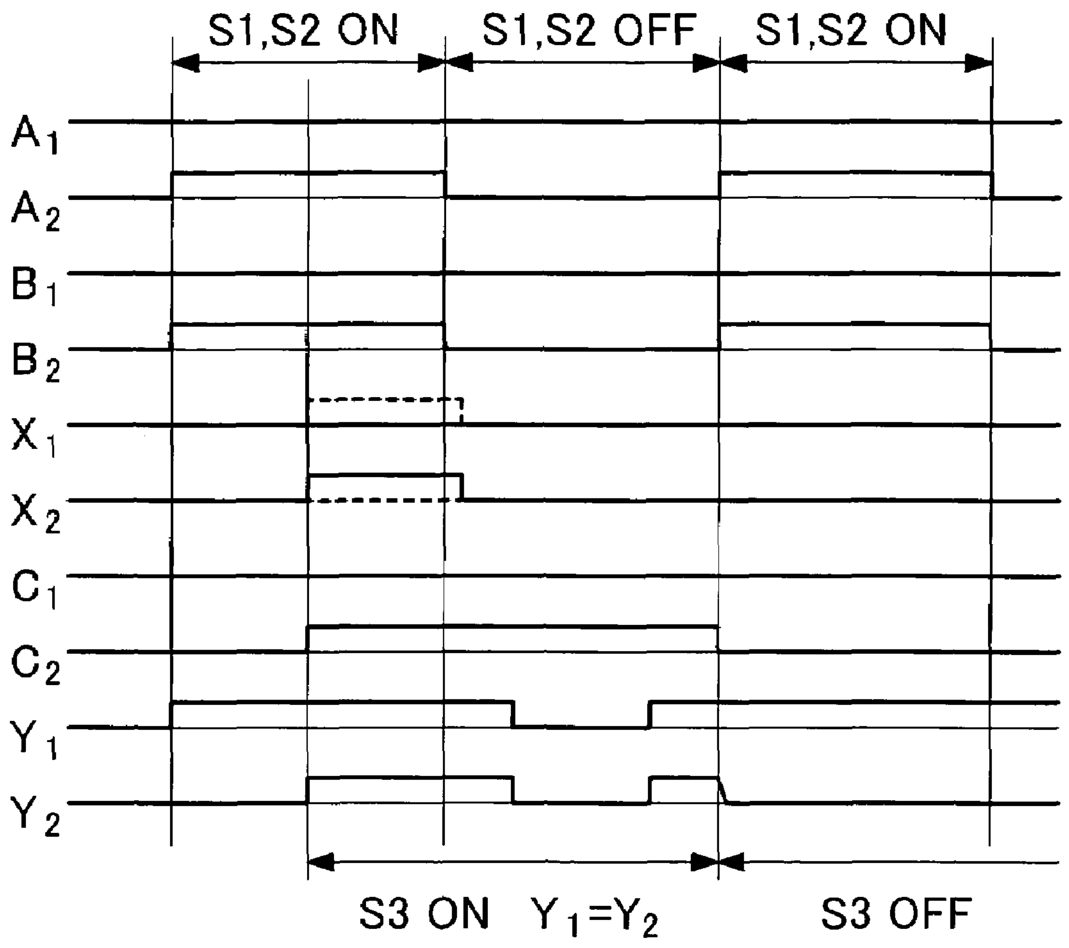

FIGS. 9A through 9C show an example of a latchable MEMS switch device configured by using three cold switches S1, S2 and S3. FIG. 9B is its top view. FIG. 9A is a cross-sectional view of the structure depicted along line D–D' in FIG. 9B. FIG. 9C is a timing chart showing its latching mechanism. In this configuration, the switch S3 is a switch with latch function. While the switch S3 is in the ON state, two signal terminals (stationary contacts) Y1 and Y2 are short-circuited with each other (Y1=Y2). While the switch S3 is in the OFF state, the signal terminals Y1 and Y2 are brought into an open-circuit state. How to fabricate this MEMS switch device having cold switches connected in series is described later. In each of the cold switches S1, S2 and S3, the cantilever 220 is electrically isolated from the contact of cantilever (mobile contact) 212 by the insulator 215 as shown in FIG. 9A. Each cold switch is designed so that it is turned on by electrostatic force between the pull-down electrode 221 and the cantilever 220 when the potential difference between these electrodes is |Vcc| or slightly small voltage than |Vcc|. This MEMS switch device operates as described below.

The contact of pull-down electrode A1 and contact of cantilever A2 of the switch S1 are respectively set to GND and +Vcc to turn on the switch S1. Thus the terminal X1 is short-circuited to the contact of pull-down electrode C1 of the switch S3 through the top mobile contact 212 of the switch S1. Since X1 is set to GND, the pull-down electrode 221 of the switch S3 is also set to GND. Meanwhile, the contact of pull-down electrode B1 and contact of cantilever B2 of the switch S2 are also set to GND and +Vcc respectively to turn on the switch S2. Thus, the terminal X2 of the switch S3 is short-circuited to the cantilever of the switch S3 through the top mobile contact 212 of the switch S2. At this time, setting the terminal X2 to +Vcc turns on the switch S3 since a potential difference of |Vcc| is formed between the cantilever 220 and pull-down electrode 221 of the switch S3, resulting in the signal terminals (stationary contacts) Y1 and Y2 short-circuited with each other by the top mobile contact 212 of the switch S3.

If the switches S1 and S2 are turned off at this time by setting the contact of cantilever A2 of the switch S1 and the contact of cantilever B2 of the switch S2 to GND, the switch S3 can remain in the ON state since the electrostatic force continues to work between the cantilever 220 and pull-down electrode 221 of the switch S3 due to the charge accumulated between them. Note that the terminal X1 is set to GND after the switch S3 remains in the ON state.

Since the switches S1 and S2 are cold switches, the accumulated charge is not released from the switch S3 when the switches S1 and S2 are turned off. Therefore, as compared with the aforementioned first and second embodiments, the present embodiment can keep the MEMS switch device in the ON state more reliably.

To turn off the switch S3, the switches S1 and S2 are turned on by setting the contact of cantilever A2 of the switch S1 and the contact of cantilever B2 of the switch S2 to +Vcc and the contact of pull-down electrode A1 of the switch S1 and the contact of pull-down electrode B1 of the switch S2 to GND. Further, the terminal X2 is set to GND to release the charge accumulated between the cantilever 220 and pull-down electrode 221 of the switch S3, which turns off the switch S3 since the electrostatic force eliminates between the cantilever 220 and pull-down electrode 221 of the switch S3.

Although in the above description, the terminal X1 (contact of pull-down electrode C1) and terminal X2 (contact of cantilever C2) are respectively set to GND and +Vcc in order to turn on the switch S3, the switch S3 may also be turned on by inversely setting the terminals X1 and X2 (contact of pull-down electrode C1 and contact of cantilever C2) to +Vcc and GND as indicated by dotted lines in the timing chart of FIG. 9C. Further, any voltages other than GND and +Vcc can be set to the terminals X1 and X2 (contact of pull-down electrode C1 and contact of cantilever C2) if a potential difference of |Vcc| or larger is formed between the terminal X1 (contact of pull-down electrode C1) and the terminal X2 (contact of cantilever C2). The same holds for the switches S1 and S2 when they are turned on.

In addition, although in the above description, the terminal X1 (contact of pull-down electrode C1) and terminal X2 (contact of cantilever C2) are set to GND to turn off the switch S3, they must not necessarily be set to GND. They may be any voltages other than GND if the potential difference between the terminal X1 (contact of pull-down electrode C1) and the terminal X2 (contact of cantilever C2) is made smaller than |Vcc|. However, setting them to the same voltage can turn off the switch S3 more reliably. The same holds for the switches S1 and S2 when they are turned off.

The following describes how to fabricate the latchable MEMS switch device that is composed of cold switches as shown in FIG. 9A. Until the structure shown in FIG. 3D is obtained, the manufacturing procedure is the same as for a MEMS switch device composed of hot and cold switches.

Figure 10A:
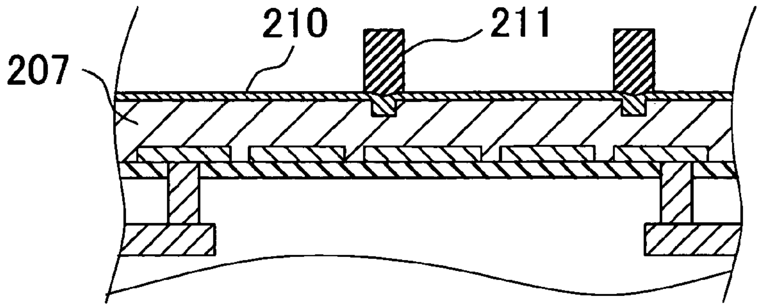
FIGS. 10A through 10D are cross-sectional views partly indicating how the MEMS switches in the third embodiment of the present invention are fabricated.
Figure 10B:
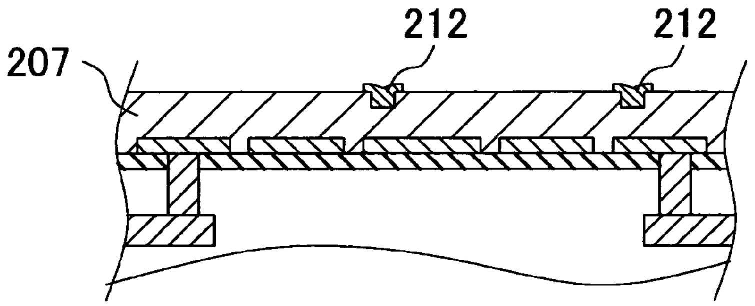

Then, after the surface is cleaned, a metal film 210 is deposited which is to be used to form mobile contacts. In the present embodiment, poly-Si is used as the metal film. A resist pattern 211 for the cantilever of each cold switch is formed by photolithography process (FIG. 10A). After the metal film 210 is removed, the resist pattern 211 is removed (FIG. 10B).

Figure 10C:
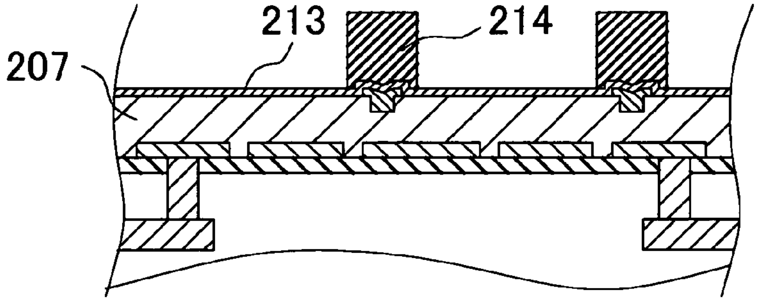

Then, after aluminum oxide is deposited as an insulation film 213 on the surface, a resist pattern 214 is formed so as to cover the mobile contact or contact of cantilever 212 of each cold switch as shown in FIG. 10C.

Figure 10D:
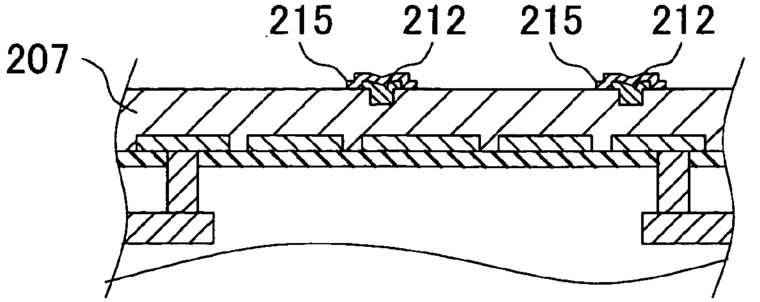

Then, after the aluminum oxide insulation film 213 is removed by dry etching, the resist 214 is removed as shown in FIG. 10D. At this time, the contacts of cantilevers (mobile contacts) 215 are covered by aluminum oxide insulators 215.

Figure 11A:
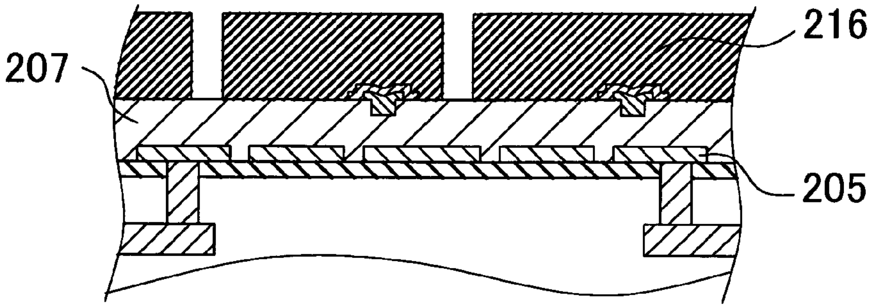
FIGS. 11A through 11D are cross-sectional views partly indicating how MEMS switches in the third embodiment of the present invention are fabricated.
Figure 11B:
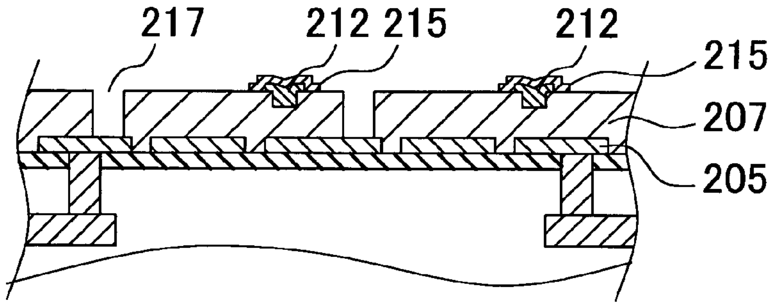

Further, after cleaning process is done, a resist pattern 216 to form the contact hole of each cantilever is formed by photolithography process (FIG. 11A). Then after the sacrifice layer 207 is etched to the surface of the underlayer metal lines 205, the resist 216 is removed as shown in FIG. 11B.

Figure 11C:
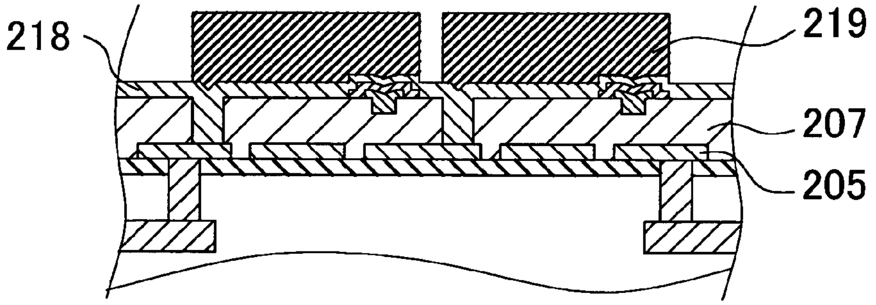
Figure 11D:
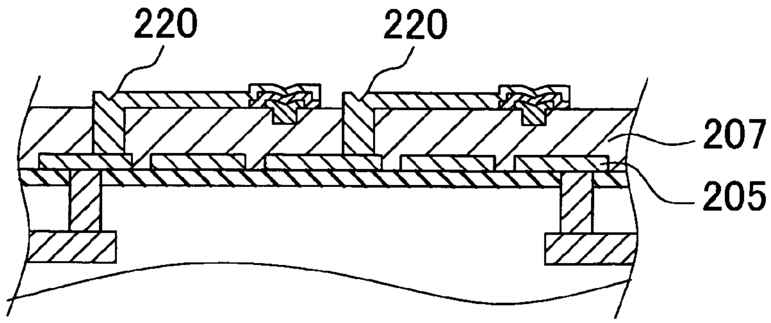

On this surface, poly-Si is deposited as a metal film 218 to form the cantilevers 220. Then, a pattern for the cantilevers is transferred to a resist 219 as shown in FIG. 11C.

Using this resist pattern as a mask, the metal film 218 is etched to form the cantilever 220 of each cold switch. After that, the resist 219 is removed (FIG. 1D).

Then, after the sacrifice layer 207 is removed by wet etching, drying is done to complete the switch structure shown in FIG. 9A.

The present embodiment is advantageous in that the switching voltage can be designed easily since all switches in the MEMS switch device are cold switches and they can have the same configuration. The aforementioned first and second embodiments are preferable to the present embodiment in that they can be implemented by smaller areas since the terminals X1 and X2 to supply voltages to the cantilever 220 and pull-down electrode 221, shown in FIG. 9B, must not be formed.

Embodiment 4

The MEMS switch device according to the present invention is characterized in that a charge is accumulated between mobile and a pull-down electrode and a cantilever and the charge is kept so that an electrostatic force between the pull-down electrode and cantilever continues to work in order to retain the MEMS switch device in the ON state. In the aforementioned embodiments, each MEMS switch device is operated in a depression atmosphere or inert gas-filled environment. In such an environment, small leak current may flow along the surfaces of electrodes while the MEMS switch device is kept in the ON state, decreasing the quantity of the accumulated charge.

To prevent this, the surfaces of the pull-down electrode and cantilever are covered with insulator film. The following describes such a fourth embodiment of the present invention.

Figure 12A:
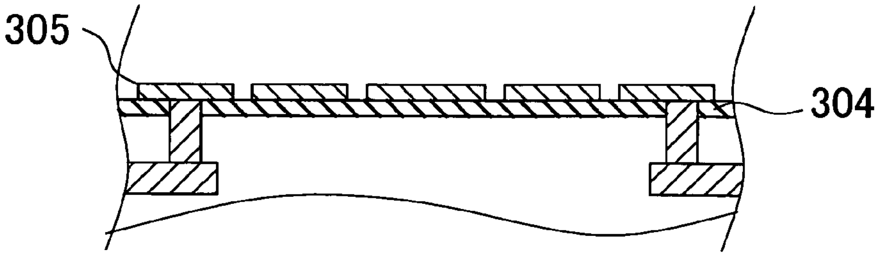
FIGS. 12A through 12D are cross-sectional views partly indicating how the MEMS switches in a fourth embodiment of the present invention are fabricated.

In the progress of process, FIG. 12A corresponds to FIG. 3B. In FIG. 12A, poly-Si underlayer electrodes 305 are formed after a SiN film is deposited on the surface of an interlayer dielectric film 304.

Figure 12B:
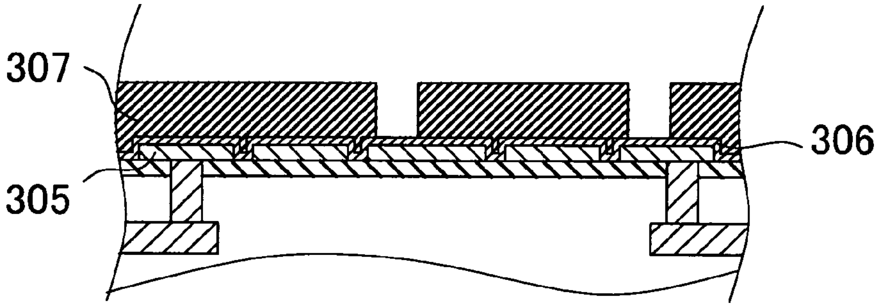

Then, as shown in FIG. 12B, after an aluminum oxide insulator 306 is deposited thereon, a resist pattern 307 for each switch is formed by photolithography process with a portion to come into contact area corresponding to a mobile contact of cantilever. The deposited aluminum oxide insulator 306 covers the surface of each pull-down electrode for each switch in order to minimize the surface leak current.

Figure 12C:
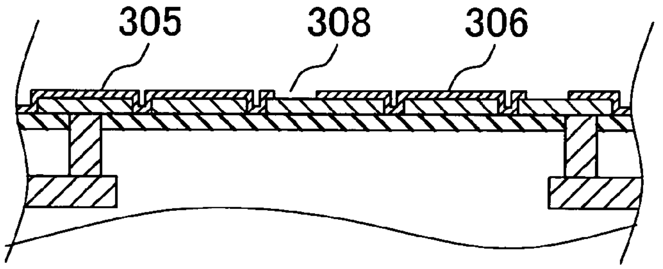

After the insulator 306 is etched by using the resist pattern 307 as a mask to form a contact hole 308, the resist 307 is removed as shown in FIG. 12C.

Figure 12D:
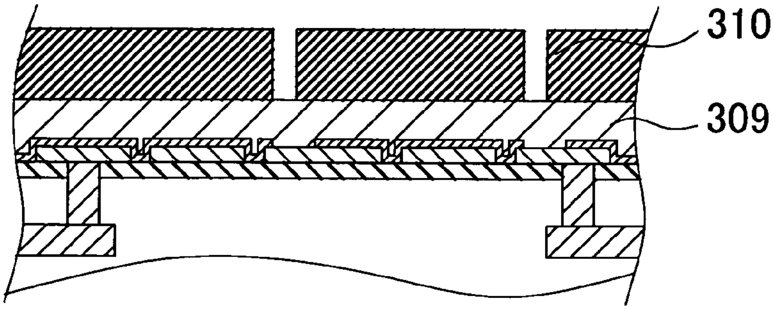

Then after the surface is cleaned, plasma TEOS is deposited as a sacrifice layer 309 which will be removed to form a gap in each switch. Thereon, a pattern for each switch is transferred to a resist 310 by photolithography process with a portion corresponding to the mobile contact of cantilever as shown in FIG. 12D.

Figure 13A:
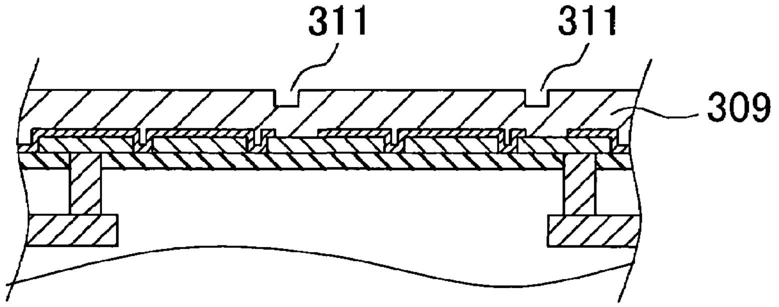
FIGS. 13A through 13D are cross-sectional views partly indicating how the MEMS switches in the fourth embodiment of the present invention are fabricated.

Then after dents 311 are formed on the sacrifice layer by using this resist as a mask, the resist is removed as shown in FIG. 13A.

Figure 13B:
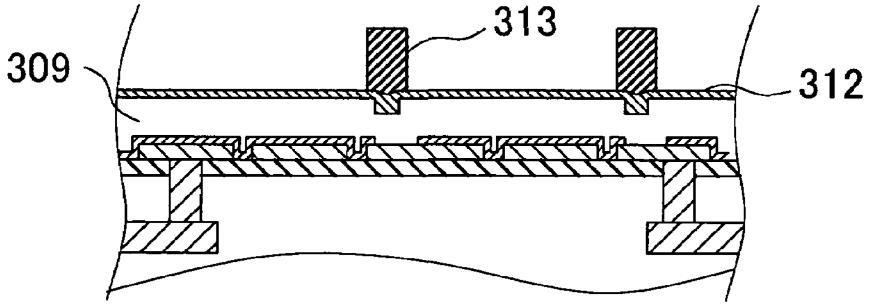

Then after the surface is cleaned, a metal film 312 is deposited to form the contact of cantilever. Poly-Si is used as the metal film in the present embodiment, too. A resist pattern 313 that masks the mobile contact area of cantilever for each cold switch is formed by photolithography process (FIG. 13B).

Figure 13C:
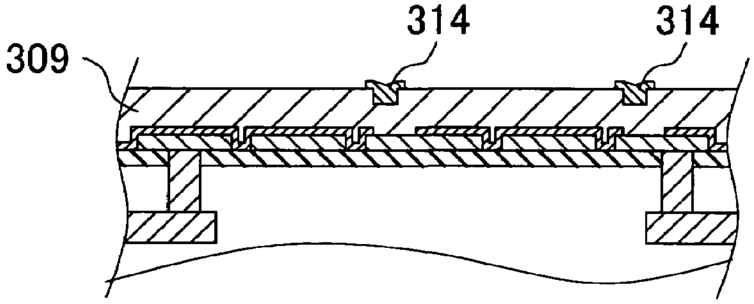

Then, after the metal film 312 is patterned by using this mask to form the mobile contact of cantilever 314 of each switch, the resist 313 is removed (FIG. 13C).

Figure 13D:
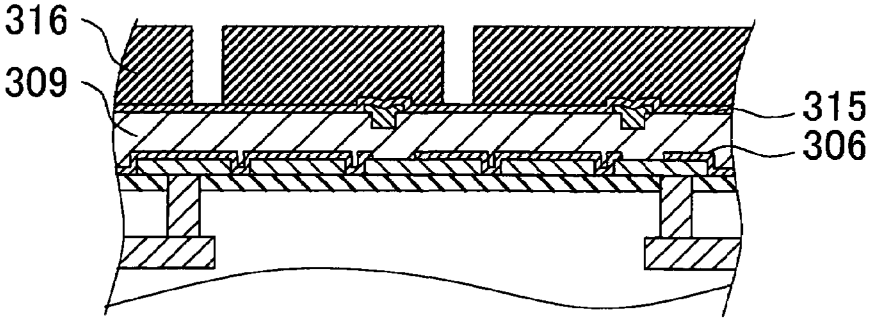

Then, after aluminum oxide is deposited on the surface as an insulator 315, a resist pattern 316 corresponding to a contact hole for the base of cantilever is formed by photolithography process (FIG. 13D).

Figure 14A:
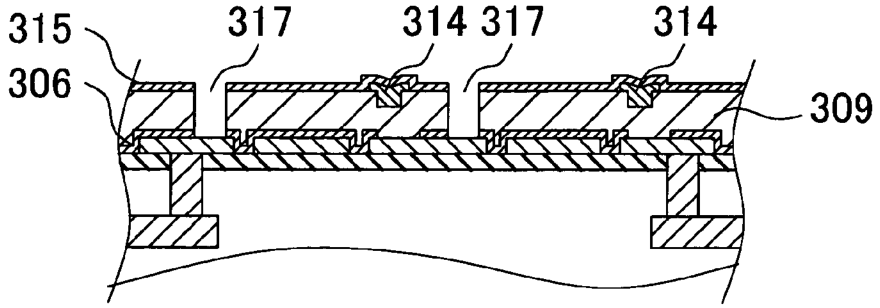
FIGS. 14A through 14D are cross-sectional views partly indicating how the MEMS switches in the fourth embodiment of the present invention are fabricated.

Using this resist 316 as a mask, the aluminum oxide insulator 315, the sacrifice layer 309 and the aluminum oxide insulator 306 are continuously etched to form contact holes 317 down to the surface of the underlayer metal film 305. Thereafter, the resist 316 is removed as shown in FIG. 14A.

Figure 14B:
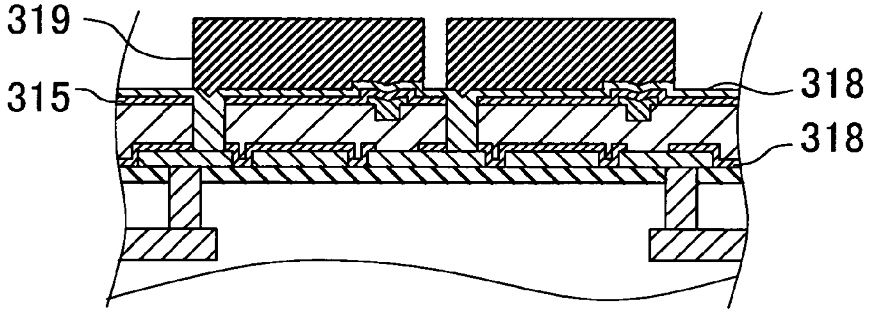
Figure 14C:
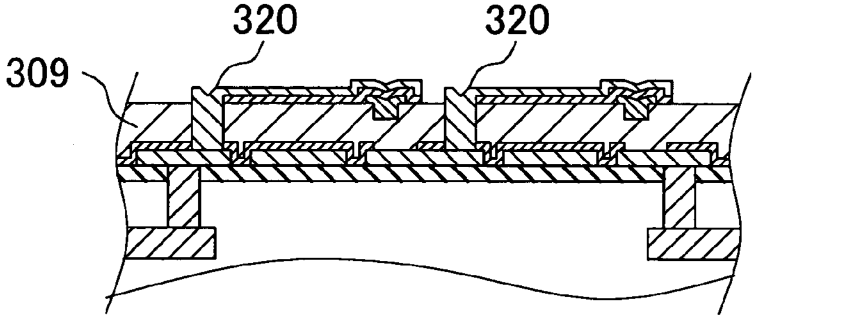

On the surface, poly-Si is deposited as a metal film 318 to form the cantilever of each switch. Then, a pattern for the cantilevers is transferred to a resist 319 as shown in FIG. 14B.

Then after the metal film 318 and the aluminum insulator 315 thereunder are etched using this resist pattern 319 as a mask to form the cantilever 320 of each cold switch, the resist 319 is removed.

Figure 14D:
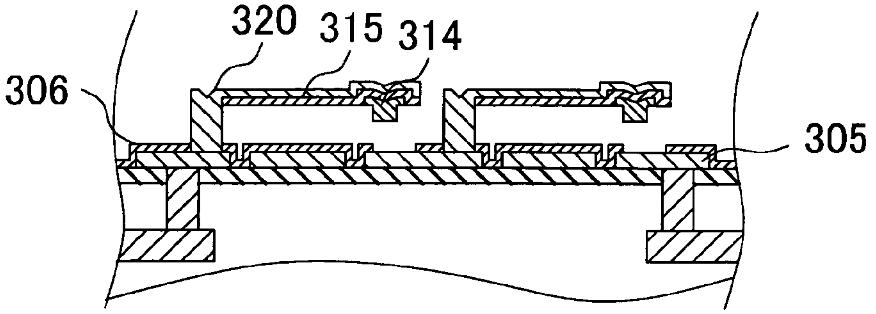
Figure 15:
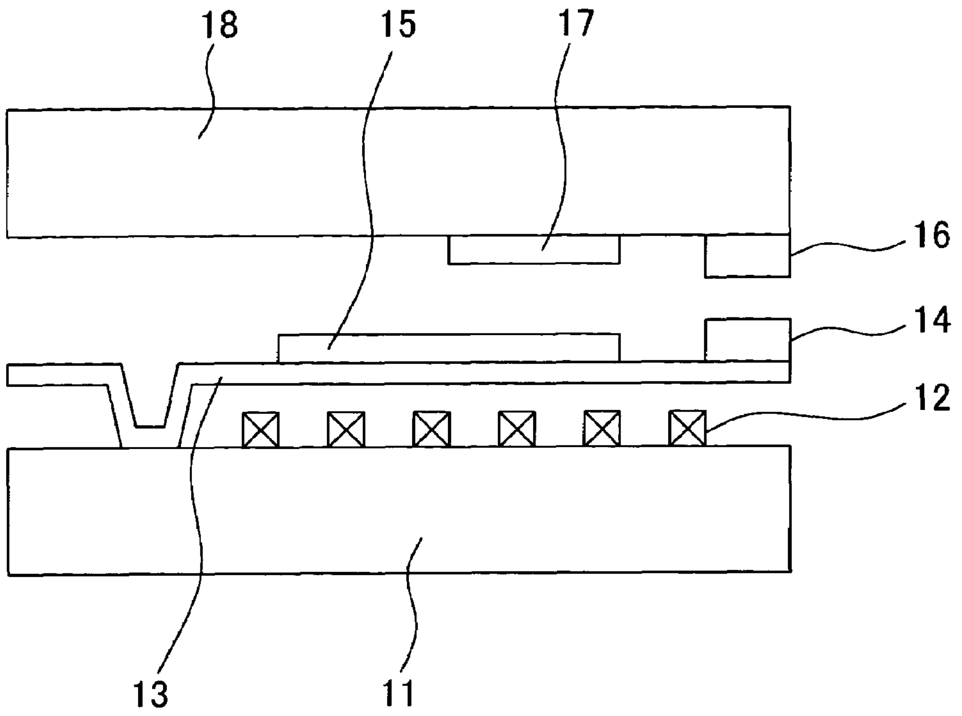
FIG. 15 is a cross-sectional view of a first prior art MEMS switch with latch function.
Figure 16:
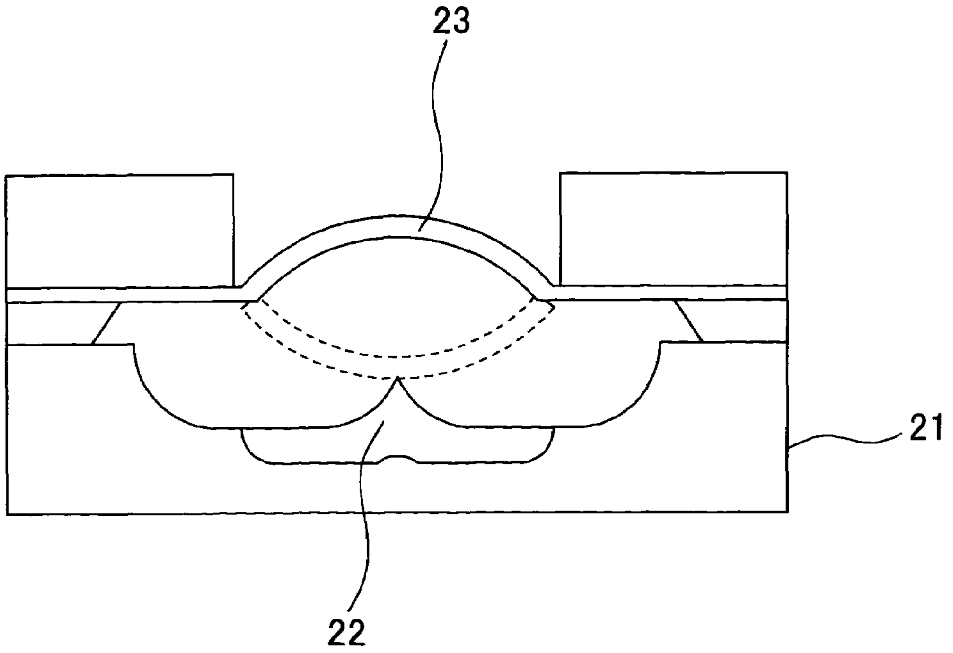
FIG. 16 is a cross-sectional view of a second prior art MEMS switch with latch mechanism.

Then, after the sacrifice layer 309 is removed by wet etching, drying is performed to complete the switch structure shown in FIG. 14D.

In the present embodiment, since not only the top surfaces of the pull-down electrodes and other underlayer electrodes 305 are covered but also the bottom surfaces of the cantilevers 320 are covered respectively by aluminum oxide films 306 and 315, it is possible to improve the reliability of the MEMS switch device by reducing the surface leak current between the pull-down electrode and cantilever while the MEMS switch device is kept in the ON state. However, since each poly-Si cantilever 320 is stacked on an aluminum oxide film 315, deliberate stress control is required to minimize the warping of the cantilever 320. Therefore, it is most preferable to cover only the pull-down electrodes with the aluminum oxide 306.

The present embodiment, combined with any of the aforementioned embodiments, allows the MEMS switch device to be kept in the ON state more reliably.

EXPLANATION OF REFERENCE NUMERALS

11. Substrate,
12. Coil,
13. Cantilever,
14. Contact on Cantilever,
15. Magnetic Material on Cantilever,
16. Contact of Pull-down Electrode,
17. Magnetic Material on Pull-down Electrode,
18. another substrate,
21. Substrate,
22. Lower Electrode,
23. Diaphragm,
101. Interlayer Insulator Film,
102. Underlayer Metal Line,
103. Plug,
104. Cap Film of Interlayer Insulator Film,
105. Underlayer Metal Film,
106. Sacrifice Layer,
107. Resist,
108. Partial Etched Pattern on Sacrifice Layer,
109. Contact-electrode Pattern of Cantilever,
110. Insulator Film,
111. Resist,
112. Resist,
113. Etched Pattern to Connect Cantilever,
114. Metal Film,
115. Resist,
116. Cantilever of Hot Switch,
117. Cantilever of Cold Switch,
118. Pull-down electrode of Hot Switch,
119. Pull-down electrode of Cold Switch,
205. Underlayer Electrode,
207. Sacrifice Layer,
210. Metal Film,
211. Resist,
212. Mobile Contact-electrode Pattern of Cantilever,
213. Insulator Film,
214. Resist,
215. Insulator Film Covering Mobile Contact-electrode Pattern of Electrode,
216. Resist,
217. Etched Pattern to Connect cantilever,
218. Metal Film,
219. Resist,
220. Cantilever,
221. Pull-down Electrode,
304. Cap Film of Interlayer insulator Film,
305. Underlayer Metal Line,
306. Insulator Film,
307. Resist,
308. Contact Hole corresponding to Mobile Contact,
309. Sacrifice Layer,
310. Resist,
311. Etched Pattern on Sacrifice Layer,
312. Metal Film,
313. Resist,
314. Contact-electrode pattern of Cantilever,
315. Insulator Film,
316. Resist,
317. Etched Pattern to Connect Cantilever,
318. Metal Film,
319. Resist,
320. Cantilever

What is claimed is:

1. A semiconductor device, comprising:
first and second signal lines;
a first MEMS switch having a first capacitor electrically separated from the first and second signal lines,
wherein the first MEMS switch is a cold switch; and
a second MEMS switch,
wherein the second MEMS switch is connected to a first electrode of the first capacitor, and
the first MEMS switch is turned on by making the second MEMS switch be turned on.

2. The semiconductor device according to claim 1, wherein a second electrode of the first capacitor is grounded.

3. The semiconductor device according to claim 1, wherein the second MEMS switch has a second capacitor.

4. The semiconductor device according to claim 3, wherein the second capacitor is electrically separated from the first capacitor.

5. The semiconductor device according to claim 1, further comprising:

a third MEMS switch, wherein the third MEMS switch is connected to a second electrode of the first capacitor.

6. The semiconductor device according to claim 5, wherein the third MEMS switch has a third capacitor.

7. The semiconductor device according to claim 5, wherein the third MEMS switch has a third capacitor, and wherein the third capacitor is electrically separated from the first capacitor.

8. A semiconductor device, comprising:

first and second signal lines;

a first MEMS switch having a first capacitor electrically separated from the first and second signal lines; and a second MEMS switch, wherein the second MEMS switch is connected to a first electrode of the first capacitor; and wherein the second MEMS switch is turned on and a first voltage required to turn on the first MEMS switch is supplied to the first electrode via the second MEMS switch, so that the first MEMS switch is turned on;

the second MEMS switch is turned off when the first voltage is supplied to the first electrode, so that the first MEMS switch is kept in the on state; and the second MEMS switch is turned on and a second voltage required to turn off the first MEMS switch is supplied to the first electrode via the second MEMS switch, so that the first MEMS switch is turned off.

9. A semiconductor device, comprising:

first and second signal lines;

a first MEMS switch having a first capacitor electrically separated from the first and second signal lines;

a second MEMS switch, wherein the second MEMS switch is connected to a first electrode of the first capacitor; and a third MEMS switch, wherein the third MEMS switch is connected to a second electrode of the first capacitor; and wherein the second MEMS switch and the third MEMS switch are turned on and a first potential difference required to turn on the first MEMS switch is supplied to between the first and second electrodes of the first capacitor via the second MEMS switch and the third MEMS switch, whereby the first MEMS switch is turned on;

the second MEMS switch and the third MEMS switch are turned off when the first potential difference is supplied to between the first and second electrodes of the first capacitor, whereby the first MEMS switch is kept in the on state; and the second MEMS switch and the third MEMS switch are turned on and via the second MEMS switch and the third MEMS switch, either a second potential difference required to turn off the first MEMS switch is supplied to between the first and second electrodes of the first capacitor or the same voltage is supplied to the first and second electrodes of the first capacitor, whereby the first MEMS switch is turned off.

10. A semiconductor device, comprising:

a first MEMS switch including a first pull-down electrode, a first contact of a first signal line, a first cantilever and a contact on the first cantilever, and the first MEMS switch being capable of pushing/releasing the contact on the first cantilever to/from the first contact of the first signal line by controlling a potential difference between the first pull-down electrode and the first cantilever; and a second MEMS switch including a second pull-down electrode, a second contact of a second signal line and a second cantilever, and the second MEMS switch is capable of pushing/releasing the second cantilever to/from the second contact of the second signal line by controlling a potential difference between the second pull-down electrode and the second cantilever, wherein the second contact of the second signal line is connected to the first cantilever or the first pull-down electrode.

11. The semiconductor device according to claim 10, wherein the first contact of the first signal line and the contact on the first cantilever are connected to a signal line of a circuit.

12. The semiconductor device according to claim 10, further comprising:

a third contact of a third signal line, wherein:

the first contact of the first signal line and the third contact of the third signal line are connected to the signal line of a circuit; and the contact on the first cantilever is brought into contact with the first contact of the first signal line and the third contact of the third signal line by giving a potential difference between the first pull-down electrode and the first cantilever so that the first contact of the first signal line is short-circuited with the third contact of the third signal line.

13. The semiconductor device according to claim 10, wherein:

the second contact of the second signal line is connected to the first cantilever;

the first pull-down electrode, the second pull-down electrode and the second cantilever are connected to a voltage supply circuit;

the ground voltage is always given to the first pull-down electrode when the first MEMS switch is turned on, is retained in the on state or is turned off;

the ground voltage is given to the second pull-down electrode and a first voltage is given to the second cantilever, whereby the first MEMS switch is turned on;

the ground voltage is then given to the second cantilever so as to retain the first MEMS switch in the on state; and the ground voltage is then given to the second cantilever and the first voltage is given to the second pull-down electrode, whereby the first MEMS switch is turned off.

14. The semiconductor device according to claim 10, further comprising:

a third MEMS switch including a third pull-down electrode, a third contact of a third signal line and a third cantilever, and the third MEMS switch being capable of pushing/releasing the third cantilever to/from the third contact of the third signal line by controlling a potential difference between the third pull-down electrode and the third cantilever, and wherein the second contact of the second signal line is connected to the first cantilever and the third contact of the third signal line is connected to the first pull-down electrode.

15. The semiconductor device according to claim 14, wherein:

the second pull-down electrode, the third pull-down electrode, the second cantilever and the third cantilever are connected to a voltage supply circuit;

a first voltage is given to the second pull-down electrode and the third cantilever and a second voltage is given to the second cantilever and the third pull-down electrode, whereby the first MEMS switch is turned on;

the first voltage is then given to the second cantilever and the third pull-down electrode, whereby the first MEMS switch is retained in the on state; and the first voltage is then given to the second cantilever and the third pull-down electrode and the second voltage is given to the second pull-down electrode and the third cantilever, whereby the first MEMS switch is turned off.

16. The semiconductor device according to claim 14, wherein:

the second MEMS switch further comprises a fourth contact of a fourth signal line and the third MEMS switch further comprises a fifth contact of a fifth signal line;

when the second MEMS switch is turned on, the second contact of the second signal line is short-circuited with the fourth contact of the fourth signal line;

when the third MEMS switch is turned on, the third contact of the third signal line is short-circuited with the fifth contact of the fifth signal line;

the second pull-down electrode, the second cantilever, the third pull-down electrode, the third cantilever, the fourth contact of the fourth signal line and the fifth contact of the fifth signal line are connected to a voltage supply circuit;

a potential difference capable of turning on the first MEMS switch is supplied to between the fourth contact of the fourth signal line and the fifth contact of the fifth signal line and the second MEMS switch and the third MEMS switch are turned on, whereby the first MEMS switch is turned on;

the second MEMS switch and the third MEMS switch are then turned off so that the first MEMS switch is retained in the on state; and a potential difference capable of turning off the first MEMS switch is supplied to between the fourth contact of the fourth signal line and the fifth contact of the fifth signal line and the second MEMS switch and the third MEMS switch are turned on, whereby the first MEMS switch is turned off.

* * * * *